(12) United States Patent
Bi et al.

(10) Patent No.: US 10,306,788 B2
(45) Date of Patent: May 28, 2019

(54) FLEXIBLE BOTTOM SHELL AND FLEXIBLE DISPLAY DEVICE

(71) Applicant: WUHAN CHINA STAR OPTOELECTRONICS TECHNOLOGY CO., LTD., Wuhan, Hubei (CN)

(72) Inventors: Wei Bi, Hubei (CN); Chih Ming Hsu, Wuhan Hubei (CN); Juanjuan Wang, Wuhan Hubei (CN)

(73) Assignee: WUHAN CHINA START OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 15/569,116

(22) PCT Filed: Oct. 16, 2017

(86) PCT No.: PCT/CN2017/106387
§ 371 (c)(1),
(2) Date: Oct. 25, 2017

(87) PCT Pub. No.: WO2018/196293
PCT Pub. Date: Nov. 1, 2018

(65) Prior Publication Data
US 2018/0317333 A1    Nov. 1, 2018

(30) Foreign Application Priority Data

Apr. 28, 2017   (CN) .......................... 2017 1 0293037

(51) Int. Cl.
*H05K 5/00* (2006.01)
*H05K 5/02* (2006.01)
(Continued)

(52) U.S. Cl.
CPC ............. *H05K 5/0226* (2013.01); *E05D 3/06* (2013.01); *E05D 7/00* (2013.01); *G02F 1/13* (2013.01);
(Continued)

(58) Field of Classification Search
USPC ......................................................... 361/755
See application file for complete search history.

(56) References Cited

U.S. PATENT DOCUMENTS 9,179,559 B1 * 11/2015 Kim ...................... G06F 1/1616
9,348,450 B1 * 5/2016 Kim ...................... G06F 1/1681
(Continued)

FOREIGN PATENT DOCUMENTS

| CN | 104598079 A | 5/2015 |
|---|---|---|
| CN | 106340243 A | 1/2017 |
| CN | 205942179 U | 2/2017 |

*Primary Examiner* — Hung S. Bui
(74) *Attorney, Agent, or Firm* — Mark M. Friedman

(57) ABSTRACT

The present disclosure provides a flexible bottom shell, where the flexible bottom shell includes a first half shell, a second half shell, and a bendable part connected the first half shell and the second half shell, where the bendable part includes a plurality of connection plates, the plurality of the connection plates are successively bonded and are successively hinged together. Hinge pieces include a fixed plate, a fixed axle, and a pin axle. The fixed axle and the pin axle are perpendicular to a surface of the fixed plate. The fixed axle is connected to the fixed plate, and the pin axle is connected to the adjacent connection plates.

13 Claims, 3 Drawing Sheets

(51) Int. Cl.
*E05D 7/00* (2006.01)
*G02F 1/13* (2006.01)
*H04M 1/02* (2006.01)
*E05D 3/06* (2006.01)
*H01L 51/52* (2006.01)

(52) U.S. Cl.
CPC ........ *H04M 1/0202* (2013.01); *H05K 5/0017* (2013.01); *E05Y 2800/205* (2013.01); *E05Y 2800/244* (2013.01); *E05Y 2900/606* (2013.01); *H01L 51/5237* (2013.01); *H01L 2251/5338* (2013.01)

(56) References Cited

U.S. PATENT DOCUMENTS

| | | | | |
|---|---|---|---|---|
| 9,851,759 | B2* | 12/2017 | Tazbaz | G06F 1/1681 |
| 2011/0063783 | A1* | 3/2011 | Shim | G06F 1/1615 |
| | | | | 361/679.01 |
| 2013/0219663 | A1* | 8/2013 | Cai | G06F 1/1681 |
| | | | | 16/371 |
| 2016/0163282 | A1 | 6/2016 | Hsieh et al. | |
| 2017/0010634 | A1 | 1/2017 | Ahn et al. | |

* cited by examiner

FLEXIBLE BOTTOM SHELL AND FLEXIBLE DISPLAY DEVICE

BACKGROUND OF THE INVENTION

1. Field of the Invention

The present disclosure relates to the field of displays, and more particularly to a flexible bottom shell and a flexible display device.

2. Description of the Prior Art

Organic light emitting diodes (OLED) display devices are a new type of flat panel display devices. OLED display devices have more advantages, such as easy manufacturing process, low cost, low power dissipation, high lamination brightness, great working temperature range, a thin profile, fast response speed, and easily acts as a flexible display. Therefore, OLED display devices have vast application prospects.

Some flexible display devices in the prior art can bend in the shape of an arc, to make the screen of the display device freely switch between a flat status and a small curvature surface status. However, when the flexible display devices of the prior art bends, serious folds appear in a bendable part of the flexible display devices, further causing poor display.

In summary, if the flexible display devices of the prior art do not have a good bendable structure for support, when the flexible display devices of the prior art bend, serious folds appear in the bendable part of the flexible display devices, further causing poor display.

SUMMARY OF THE INVENTION

The aim of the present disclosure is to provide a flexible bottom shell comprising a plurality of connection plates hinging with each other, when the flexible bottom shell bends, the connection plates have a uniform stress at the bendable position of the flexible display panel, further avoiding folds appearing in the flexible display device which affect display, and solving the issue that when the flexible display devices of the prior art bend, serious folds appear in the bendable position of the flexible display devices, further causing poor display.

In order to solve the above issue, the technical scheme of the present disclosure is as follows:

A flexible bottom shell, comprising:

a first half shell receiving a front portion of a display device;

a second half shell receiving a tail end portion of the display device; the second half shell is opposite to the first half shell; and a bendable part receiving a middle portion of the display device.

A first end of the bendable part is connected to a terminal end of the first half shell, and a second end of the bendable part corresponding to the first end of the bendable part is connected to a terminal end of the second half shell.

The bendable part comprises a plurality of connection plates, where the plurality of the connection plates are successively bonded and are successively hinged together.

The connection plates comprise a baseplate. A first side plate is disposed on a first end of the baseplate, and a second side plate is disposed on a second end of the baseplate corresponding to the first end of the baseplate, and the second side plate is symmetrical to the first side plate. A first fixed hole is positioned on a center of an inner side of the first side plate, and a first pin hole is positioned on an off-centered from the inner side of the first side plate. A second fixed hole is positioned on a center of an inner side of the second side plate, and a second pin hole is positioned on an off-centered from the inner side of the second side plate.

Hinge pieces are located on an inner side of the connection plates to connect the adjacent connection plates, wherein the hinge pieces comprise a fixed plate, a fixed axle, and a pin axle; the fixed axle and the pin axle are perpendicular to a surface of the fixed plate; the fixed axle is close to a first end of the fixed plate, and the pin axle is close to a second end of the fixed plate corresponding to the first end of the fixed plate.

The fixed axle is inserted into the fixed hole of the connection plates, and the pin axle is inserted into the pin holes of the connection plates.

The baseplate of the connection plates extends out to form an arcuate plate, and the arcuate plate is located on a side of the connection plates, where the pin hole is positioned on the side of the connection plates.

According to preferable embodiment of the present disclosure, chamfers are disposed on top portions of sides of the first side plate and the second side plate.

According to preferable embodiment of the present disclosure, a first sliding chute is disposed on the inner side of the first side plate, and the first sliding chute is parallel to a bottom portion of the first side plate.

A second sliding chute is disposed on the inner side of the second side plate, and the second sliding chute is parallel to a bottom portion of the first side plate; heights of the first sliding chute and the second sliding chute are the same.

According to a preferable embodiment of the present disclosure, an end of the first half shell is connected to the connection plates, and a pin hole is positioned on an inner side of the end of the first half shell. The pin hole is correspondingly connected to the pin axle of the fixed plate.

An end of the second half shell is connected to the connection plates, and a fixed hole is positioned on an inner side of the end of the second half shell. The fixed hole is correspondingly connected to the fixed axle of the fixed plate.

The present disclosure further provides another flexible bottom shell, where the flexible bottom shell comprises:

a first half shell receiving a front portion of a display device;

a second half shell receiving a tail end portion of the display device; the second half shell is opposite to the first half shell; and a bendable part receiving a middle portion of the display device;

A first end of the bendable part is connected to a terminal end of the first half shell, and a second end of the bendable part corresponding to the first end of the bendable part is connected to a terminal end of the second half shell.

The bendable part comprises a plurality of connection plates, the plurality of the connection plates are successively bonded and are successively hinged together.

The connection plates comprise a baseplate. A first side plate is disposed on a first end of the baseplate, and a second side plate is disposed on a second end of the baseplate corresponding to the first end of the baseplate, the second side plate is symmetrical to the first side plate. A first fixed hole is positioned on a center of an inner side of the first side plate, and a first pin hole is positioned on an off-centered from the inner side of the first side plate. A second fixed hole is positioned on a center of an inner side of the second side plate, and a second pin hole is positioned on an off-centered from the inner side of the second side plate.

Hinge pieces are located on an inner side of the connection plates to connect the adjacent connection plates, wherein the hinge pieces comprise a fixed plate, a fixed axle, and a pin axle; the fixed axle and the pin axle is perpendicular to a surface of the fixed plate; the fixed axle is close to a first end of the fixed plate, and the pin axle is close to a second end of the fixed plate corresponding to the first end of the fixed plate.

The fixed axle is inserted into the fixed holes of the connection plates, and the pin axle is inserted into the pin holes of the connection plates.

According to preferable embodiment of the present disclosure, chamfers are disposed on top portions of sides of the first side plate and the second side plate.

According to preferable embodiment of the present disclosure, a first sliding chute is disposed on the inner side of the first side plate, and the first sliding chute is parallel to a bottom portion of the first side plate.

A second sliding chute is disposed on the inner side of the second side plate, and the second sliding chute is parallel to a bottom portion of the first side plate; heights of the first sliding chute and the second sliding chute are the same.

According to preferable embodiment of the present disclosure, an end of the first half shell is connected to the connection plates, and a pin hole is positioned on an inner side of the end of the first half shell. The pin hole is correspondingly connected to the pin axle of the fixed plate.

An end of the second half shell is connected to the connection plates, and a fixed hole is positioned on an inner side of the end of the second half shell. The fixed hole is correspondingly connected to the fixed axle of the fixed plate.

According to the above aim of the present disclosure, a flexible display device comprises:

a flexible bottom shell comprising a first half shell, a second half shell, and a bendable part connecting the first half shell to the second half shell;

a first middle frame slidingly arranged in the first half shell;

a second middle frame slidingly arranged in the second half shell;

a flexible supporting plate; wherein a first end of the flexible supporting plate is fixed on a surface of the first middle frame;

a flexible display panel attached to a surface of the flexible supporting plate;

a flexible protecting plate attached to a surface of the flexible display panel.

The bendable part comprises a plurality of connection plates, a plurality of the connection plates are successively bonded and are successively hinged together.

The connection plates comprise a baseplate. A first side plate is disposed on a first end of the baseplate, and a second side plate is disposed on a second end of the baseplate corresponding to the first end of the baseplate, the second side plate is symmetrical to the first side plate. A first fixed hole is positioned on a center of an inner side of the first side plate, and a first pin hole is positioned on an off-centered from the inner side of the first side plate. A second fixed hole is positioned on a center of an inner side of the second side plate, and a second pin hole is positioned on an off-centered from the inner side of the second side plate.

Hinge pieces are located on an inner side of the connection plates to connect the adjacent connection plates, wherein the hinge pieces comprise a fixed plate, a fixed axle, and a pin axle; the fixed axle and the pin axle are perpendicular to a surface of the fixed plate. The fixed axle is close to a first end of the fixed plate, and the pin axle is close to a second end of the fixed plate corresponding to the first end of the fixed plate.

The fixed axle is inserted into the fixed holes of the connection plates, and the pin axle is inserted into the pin holes of the connection plates.

According to preferable embodiment of the present disclosure, the baseplate of the connection plates extends out to form an arcuate plate, and the arcuate plate is located on a side of the connection plates, the pin hole is positioned on the side of the connection plates.

According to preferable embodiment of the present disclosure, chamfers are disposed on top portions of sides of the first side plate and the second side plate.

According to preferable embodiment of the present disclosure, a first sliding chute is disposed on the inner side of the first side plate, and the first sliding chute is parallel to a bottom portion of the first side plate.

A second sliding chute is disposed on the inner side of the second side plate, and the second sliding chute is parallel to a bottom portion of the first side plate; heights of the first sliding chute and the second sliding chute are the same.

An edge of a first side of the flexible supporting plate is disposed in the first sliding chute, and an edge of a second side of the flexible supporting plate is disposed in the second sliding chute.

According to preferable embodiment of the present disclosure, an end of the first half shell is connected to the connection plates, and a pin hole is positioned on an inner side of the end of the first half shell. The pin hole is correspondingly connected to the pin axle of the fixed plate.

An end of the second half shell is connected to the connection plates, and a fixed hole is positioned on an inner side of the end of the second half shell. The fixed hole is correspondingly connected to the fixed axle of the fixed plate.

Beneficial effects of the present disclosure are: compared with the flexible display device of prior art, the present disclosure provides the flexible bottom shell of the flexible display device, when the flexible bottom shell bends, the connection plates have a uniform stress at the bendable position of the flexible display panel, further avoiding folds appearing in the flexible display device which affect display, and solving the issue that when the flexible display devices of the prior art bend, more serious folds appear in the bendable position of the flexible display devices, further causing poor display.

BRIEF DESCRIPTION OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF THE PREFERRED EMBODIMENTS

Figure 1A:
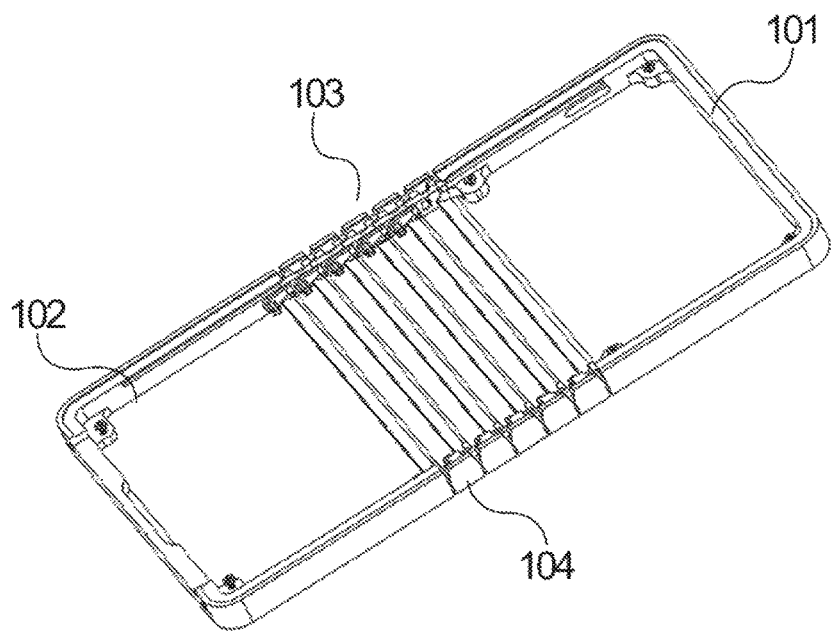
FIG. 1A is a flat status diagram of a flexible bottom shell according to the present disclosure.

The following description of every embodiment with reference to the accompanying drawings is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, components having similar structures are denoted by same numerals.

The present disclosure can solve the technical issue that when a flexible display device of the prior art bends, more serious folds appear in a bendable position of the flexible display device, further causing poor display.

As shown in FIG. 1A, a flexible bottom shell of the present disclosure is disposed on a display device, where the flexible bottom shell comprises a first half shell 101, a second half shell 102, and a bendable part 103. The flexible bottom shell is in a flat status.

The first half shell 101 is disposed on a front portion of the display device, where the first half shell 101 comprises a bottom surface and three side surfaces. Bottom ends of the three side surfaces are integrally formed with the bottom surface.

The second half shell 102 is opposite to the first half shell 101 and is used to receive a tail end portion of the display device, where the second half shell 102 comprises a bottom surface and three side surfaces. Bottom ends of the three side surfaces are integrally formed with the bottom surface. An end of the second half shell having an opening is opposite to an end of the first half shell having an open.

The bendable part 103 is used to receive a middle portion of the display device, where a first end of the bendable part 103 is connected to a terminal end of the first half shell, and a second end of the bendable part 103 corresponding to the first end of the bendable part is connected to a terminal end of the second half shell. The bendable part 103 comprises a plurality of connection plates 104 that are parallel to each other, where a plurality of the connection plates are successively bonded and are successively hinged together.

Figure 1B:
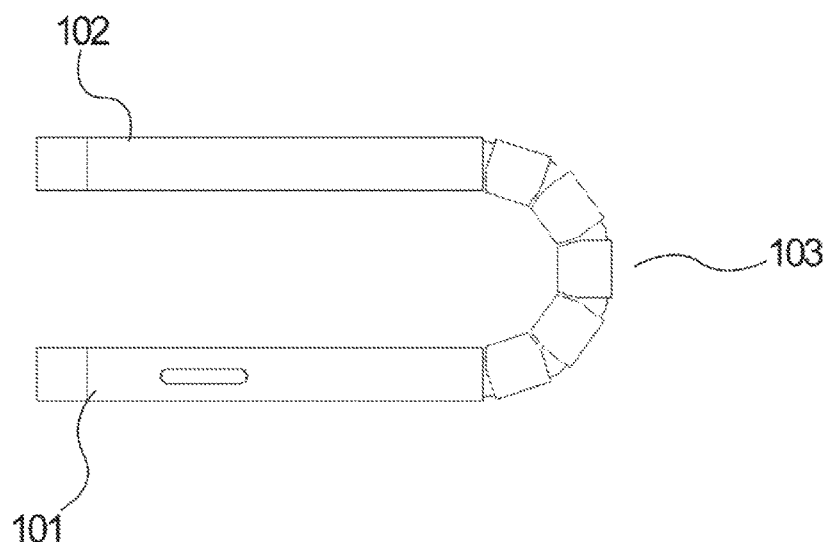
FIG. 1B is a bendable status diagram of the flexible bottom shell according to the present disclosure.

As show in FIG. 1B, the flexible bottom shell of the present disclosure comprises the first half shell 101, the second half shell 102, and the bendable part 103. The flexible bottom shell is in a bendable status.

Figure 2:
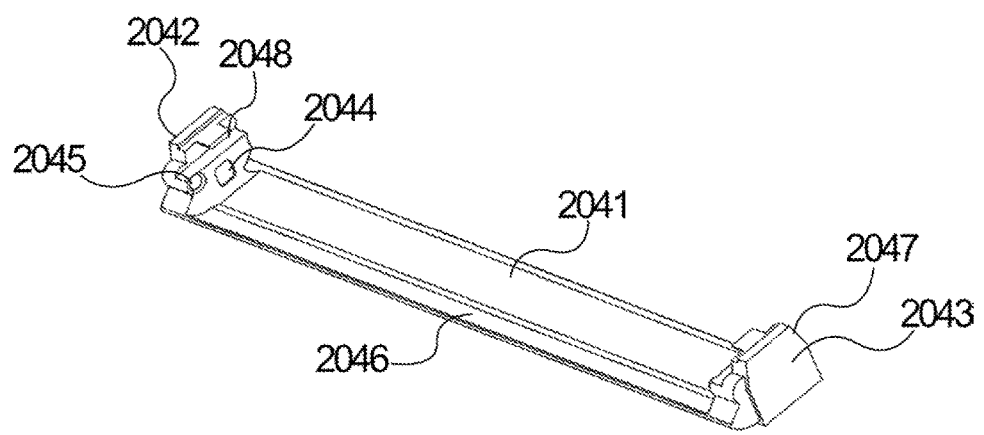
FIG. 2 is a structural diagram of connection plates of the flexible bottom shell according to the present disclosure.

As shown in FIG. 2, the connection plates comprise a baseplate 2041, where a first side plate 2042 is disposed on a first end of the baseplate 2041, and a second side plate 2043 is disposed on a second end of the baseplate 2041 corresponding to the first end of the baseplate 2041. The second side plate 2043 is symmetrical to the first side plate 2042. A plurality of the connection plates are arranged to form the bendable part. An opening of the first end of the bendable part is hinged with the end of the first half shell having the opening, and an opening of the second end of the bendable part is hinged with the end of the second half shell having the opening.

A first fixed hole 2044 is positioned on a center of an inner side of the first side plate 2042, and a first pin hole 2045 is positioned on an off-centered from the inner side of the first side plate 2042. A second fixed hole is positioned on a center of an inner side of the second side plate 2043, and a second pin hole is positioned on an off-centered from the inner side of the second side plate 2043. The first fixed hole 2044 and the second fixed hole are square holes, and the first pin hole 2045 and the second pin hole are circular holes.

A plurality of the connection plates rotates by a certain angle, and space is formed between edges of the adjacent connection plates, which causes dust or water vapor to enter, from the space, into the flexible bottom shell, which affects working life of the display device. A side of a baseplate 2041 of the connection plates extends out to form an arcuate plate 2046, and the arcuate plate 2046 is located on a side of the connection plates, where the pin hole is positioned on the side of the connection plates. When the flexible bottom shell bends, the connection plates rotate, the edges of two adjacent connection plates separate, and the arcuate plate 2046 rotates and appears at the same time. When the arcuate plate 2046 is in a bendable status or in a rest status, the surface of the arcuate plate is closely attached to the edges of the adjacent connection plates to achieve sealing of the bendable part. When the flexible bottom shell is in the flat status, the connection plates are also in the flat status, and the arcuate plate is retracted into the flexible bottom shell.

As the two adjacent connection plates are closely connected, there is a conflict between a top end of the connection plates and a top end of the adjacent connection plate when the connection plates rotate, further causing the connection plates not to rotate. Chamfers 2047 are disposed on top portions of sides of the first side plate 2042 and the second side plate 2043. When the flexible bottom bell bends, the chamfers 2047 can solve the above issue that the top ends of the adjacent connection plates limit the rotation of the connection plates. At the same time, when the connection plate rotates to engage with the chamfer of the adjacent connection plate, the rotation of the connection plate is limited, and the chamfer 2047 of the two adjacent connections plates engage each other, namely rotation angle of the connection plates is at a maximum.

A first sliding chute 2048 is disposed on the inner side of the first side plate 2042, and the first sliding chute 2048 is parallel to a bottom portion of the first side plate 2042. A second sliding chute is disposed on the inner side of the second side plate 2043, and the second sliding chute is parallel to a bottom portion of the second side plate 2043. Heights of the first sliding chute 2048 and the second sliding chute are same. The first sliding chute 2048 and the second sliding chute are used to fix the display device.

Hinge pieces are located on an inner side of the connection plates to connect the adjacent connection plates.

Figure 3:
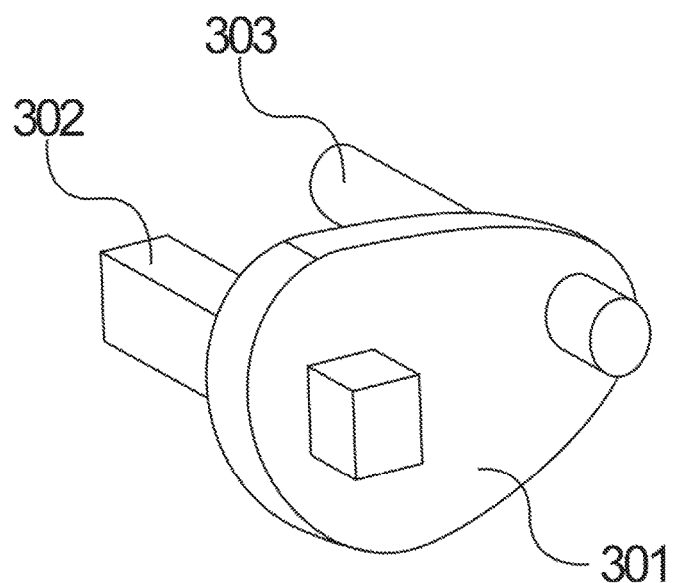
FIG. 3 is a structural diagram of hinge pieces of the flexible bottom shell according to the present disclosure.

As shown in FIG. 3, the hinge pieces comprise a fixed plate 301, a fixed axle 302, and a pin axle 303, where the fixed axle 302 and the pin axle 303 are perpendicular to a surface of the fixed plate 301. The fixed axle 302 is close to a first end of the fixed plate 301, and the pin axle 303 is close to a second end of the fixed plate 301 corresponding to the first end of the fixed plate 301. The fixed axle 302 is prism, where an end of the fixed axle 302 is inserted into the fixed hole to fix and connect between the two adjacent connection plates. The pin axle 303 is a cylinder, where an end of the pin axle 303 is inserted into the pin hole to hinge between the two adjacent connection plates.

An end of the first half shell is connected to the connection plates, and a pin hole is disposed on an inner side of the end of the first half. The pin hole is correspondingly connected to the pin axle 303 of the fixed plate 301. An end of the second half shell is connected to the connection plates, and a fixed hole is positioned on an inner side of the end of the first half. The fixed hole is correspondingly connected to the fixed axle 302 of the fixed plate 301 to connect the first half shell and the second half shell to the connection plates located on an end of the bendable part, further increasing the bendable angle of the flexible bottom shell.

Figure 4:
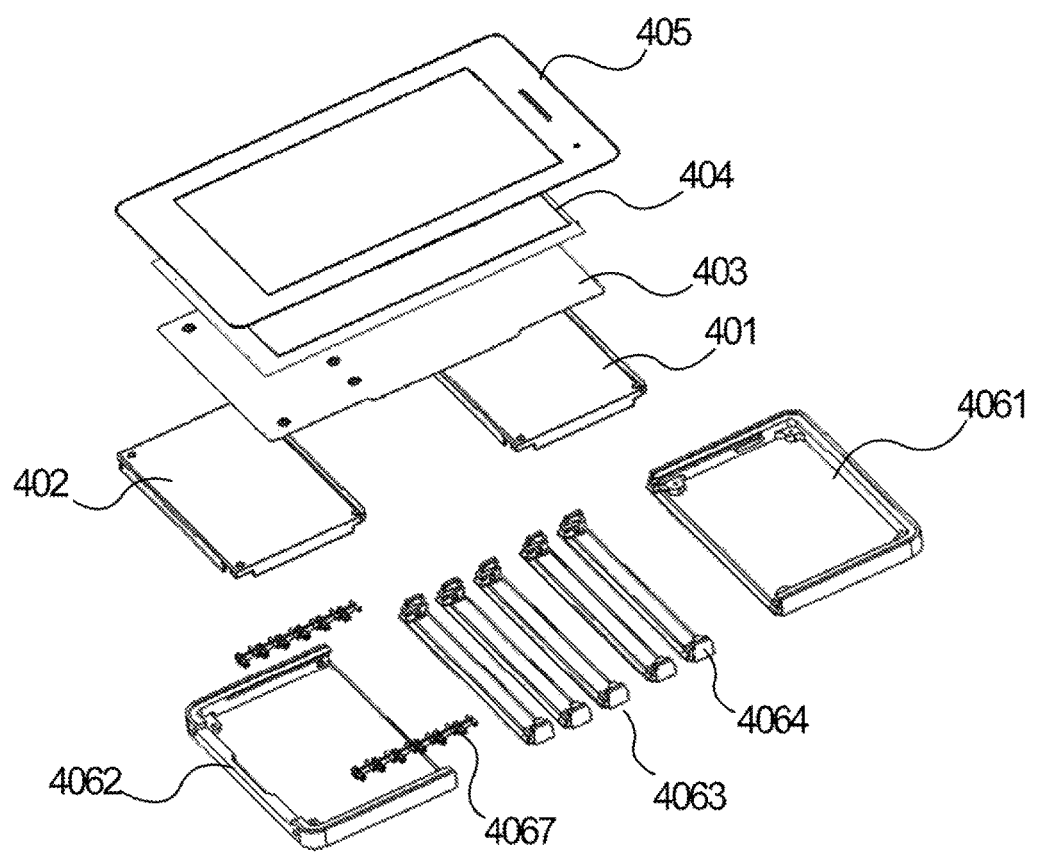
FIG. 4 is a structural diagram of a flexible display device according to the present disclosure.

According to the aim of above present disclosure, the present disclosure further provides a flexible display device. As shown in FIG. 4, the flexible display device comprises: a flexible bottom shell, a first middle frame 401, a second middle frame 402, a flexible supporting plate 403, a flexible display panel 404, and a flexible protecting plate 405.

The flexible bottom shell comprises a first half shell 4061, a second half shell 4062, and a bendable part 4063 connecting the first half shell 4061 to the second half shell 4062. The bendable part 4063 comprises a plurality of connection plates 4064, where a plurality of the connection plates 4064 are successively bonded and are successively hinged together. The connection plates 4064 comprise a baseplate, where a first side plate is disposed on a first end of the baseplate, and a second side plate is disposed on a second end of the baseplate corresponding to the first end of the baseplate, the second side plate is symmetrical to the second plate. A first fixed hole is positioned on a center of an inner side of the first side plate, and a first pin hole is positioned on an off-centered from the inner side of the first side plate. A second fixed hole is positioned on a center of an inner side of the second side plate, and a second pin hole is positioned on an off-centered from the inner side of the second side plate. Hinge pieces 407 are located on an inner side of the connection plates 4064 to connect the adjacent connection plates 4064, wherein the hinge pieces comprise a fixed plate, a fixed axle, and a pin axle, where the fixed axle and the pin axle are perpendicular to a surface of the fixed plate. The fixed axle is close to a first end of the fixed plate, and the pin axle is close to a second end of the fixed plate corresponding to the first end of the fixed plate. The fixed axle is inserted into the fixed holes of the connection plates 4064, and the pin axle is inserted into the pin holes of the connection plates 4064.

The baseplate of the connection plates 4064 extends out to form an arcuate plate, and the arcuate plate is located on a side of the connection plates 4064, where the pin hole is positioned on the side of the connection plates. When the flexible bottom shell bends, the connection plates 4064 rotates relative to the adjacent connection plate 4064, and the arcuate plate appears between the two adjacent connection plates 4064, further achieving the sealing of the bendable part 4063 of the flexible bottom shell.

Chamfers 2047 are disposed on top portions of sides of the first side plate and the second side plate to achieve rotation and limitations between the connection plates 4064.

An end of the first half shell 4061 is connected to the connection plates 4064, and pin hole is positioned on an inner side of the end of the first half shell. The pin hole is correspondingly connected to the pin axle of the fixed plate. An end of the second half shell 4062 is connected to the connection plates 4064, and a fixed hole is positioned on an inner side of the end of the first half shell; the fixed holes are correspondingly connected to the fixed axle of the fixed plate to connect the first half shell and the second half shell to the connection plates located on an end of the bendable part, further increasing the bendable angle of the flexible bottom shell.

A first sliding chute is disposed on the inner side of the first side plate, and the first sliding chute is parallel to a bottom portion of the first side plate. A second sliding chute is disposed on the inner side of the second side plate, and the second sliding chute is parallel to a bottom portion of the second side plate. Heights of the first sliding chute and the second sliding chute are same.

Chamfer edges are disposed on inner sides of the first half shell 4061 and the second half shell 4062, where the chamfer edges are flushed with top sides of the first sliding chute and the second sliding chute.

The first middle frame 401 comprises a top plate and support plates arranged on two sides of the top plate. Bottom parts of the support plates are attached with a bottom surface of the inner side of the first half shell 4061 to slide as small amplitude in the first middle frame 401.

The second middle frame 402 comprises a top plate and support plates arranged on two sides of the top plate. Bottom parts of the support plates are attached with a bottom surface of the inner side of the second half shell 4062 to slide slightly in the second middle frame 402.

Heights of the first middle frame 401 and the second middle frame 402 are slightly less than heights of the chamfer edges of the inner sides of the first half shell 4061 and the second half shell 4062.

A first end of the flexible supporting plate 403 is fixed on a surface of the first middle frame 401, and a second end of the flexible supporting plate is fixed on a surface of the second middle frame 402. The flexible supporting plate 403 is a polymer plate and uses a material having a memory function.

The supporting plate 403 has hollow structures to improve flexibility of the supporting plate 403. For example, the hollow structures can be a spacer strip-shaped structure.

The flexible display panel 404 is attached to a surface of the flexible supporting plate 403. When the flexible display panel 404 is flattened, the supporting plate 403 can provide a horizontal tension to the flexible display panel 404 attached to the surface of the flexible supporting plate, further reducing folds of the flexible display panel 404 during bending recovery.

The flexible protecting plate 405 is attached to a surface of the flexible display panel 404 to protect the flexible display panel 404.

Middle detents of the flexible supporting plate 403 are arranged in the sliding chute and the second chute. A front portion of the flexible supporting plate 403 limits the chamfer edges of the inner sides of the first half shell 4061. A tail portion of the flexible supporting plate 403 limits the chamfer edges of the inner sides of the second half shell 4062. Therefore, when the flexible display device bends and flattens, the first half shell 4061 and the second half shell 4062 correspondingly slide according to the stress of bending the flexible display device to release the stress caused by the difference between an inner diameter and an outer diameter, further making the flexible display panel 404 easily bend.

Beneficial effects of the present disclosure are: compared with the flexible display device of prior art, the present disclosure provides the flexible bottom shell of the flexible display device, when the flexible bottom shell bends, the connection plates have a uniform stress at the bendable position of the flexible display panel, further avoiding folds appearing in the flexible display device which affect the display, and solving the issue that when the flexible display devices of the prior art bend, more serious folds appear in the bendable position of the flexible display devices, further causing poor display.

It should be understood that the present disclosure has been described with reference to certain preferred and alternative embodiments which are intended to be exemplary only and do not limit the full scope of the present disclosure as set forth in the appended claims.

What is claimed is:

1. A flexible bottom shell, comprising:
   a first half shell receiving a front portion of a display device;
   a second half shell receiving a tail end portion of the display device; the second half shell is opposite to the first half shell; and
   a bendable part receiving a middle portion of the display device;
   wherein a first end of the bendable part is connected to a terminal end of the first half shell, and a second end of the bendable part corresponding to the first end of the bendable part is connected to a terminal end of the second half shell;
   wherein the bendable part comprises a plurality of connection plates, the plurality of the connection plates are successively bonded and are successively hinged together;
   wherein each connection plate comprises a baseplate; a first side plate is disposed on a first end of the baseplate, and a second side plate is disposed on a second end of the baseplate corresponding to the first end of the baseplate, the second side plate is symmetrical to the first side plate; a first fixed hole is positioned on a center of an inner side of the first side plate, and a first pin hole is positioned on an off-centered from the inner side of the first side plate; a second fixed hole is positioned on a center of an inner side of the second side plate, and a second pin hole is positioned on an off-centered from the inner side of the second side plate;
   hinge pieces located on an inner side of the connection plates, to connect the adjacent connection plates, wherein the hinge pieces comprise a fixed plate, a fixed axle, and a pin axle; the fixed axle and the pin axle are perpendicular to a surface of the fixed plate; the fixed axle is closed to a first end of the fixed plate, and the pin axle is close to a second end of the fixed plate corresponding to the first end of the fixed plate;
   wherein the fixed axle is inserted into the fixed hole of the connection plates, and the pin axle is inserted into the pin holes of the connection plates;
   wherein the baseplate of the connection plates extends out to form an arcuate plate, and the arcuate plate is located on a side of the connection plates, the pin hole is positioned on the side of the connection plates.

2. The flexible bottom shell as claimed in claim 1, wherein chamfers are disposed on top portions of sides of the first side plate and the second side plate.

3. The flexible bottom shell as claimed in claim 2, wherein a first sliding chute is disposed on the inner side of the first side plate, and the first sliding chute is parallel to a bottom portion of the first side plate;
   wherein a second sliding chute is disposed on the inner side of the second side plate, and the second sliding chute is parallel to a bottom portion of the first side plate; heights of the first sliding chute and the second sliding chute are the same.

4. The flexible bottom shell as claimed in claim 1, wherein an end of the first half shell is connected to the connection plates, and a pin hole is positioned on an inner side of the end of the first half shell; the pin hole is correspondingly connected to the pin axle of the fixed plate;
   wherein an end of the second half shell is connected to the connection plates, and a fixed hole is positioned on an inner side of the end of the second half shell; the fixed hole is correspondingly connected to the fixed axle of the fixed plate.

5. A flexible bottom shell, comprising:
   a first half shell receiving a front portion of a display device;
   a second half shell receiving a tail end portion of the display device; the second half shell is opposite to the first half shell; and
   a bendable part receiving a middle portion of the display device;
   wherein a first end of the bendable part is connected to a terminal end of the first half shell, and a second end of the bendable part corresponding to the first end of the bendable part is connected to a terminal end of the second half shell;
   wherein the bendable part comprises a plurality of connection plates, the plurality of the connection plates are successively bonded and are successively hinged together;
   wherein each connection plate comprises a baseplate; a first side plate is disposed on a first end of the baseplate, and a second side plate is disposed on a second end of the baseplate corresponding to the first end of the baseplate, the second side plate is symmetrical to the first side plate; a first fixed hole is positioned on a center of an inner side of the first side plate, and a first pin hole is positioned on an off-centered from the inner side of the first side plate; a second fixed hole is positioned on a center of an inner side of the second side plate, and a second pin hole is positioned on an off-centered from the inner side of the second side plate;
   hinge pieces located on an inner side of the connection plates to connect the adjacent connection plates, wherein the hinge pieces comprise a fixed plate, a fixed axle, and a pin axle; the fixed axle and the pin axle is perpendicular to a surface of the fixed plate; the fixed axle is closed to a first end of the fixed plate, and the pin axle is close to a second end of the fixed plate corresponding to the first end of the fixed plate;
   wherein the fixed axle is inserted into the fixed holes of the connection plates, and the pin axle is inserted into the pin holes of the connection plates.

6. The flexible bottom shell as claimed in claim 5, wherein chamfers are disposed on top portions of sides of the first side plate and the second side plate.

7. The flexible bottom shell as claimed in claim 6, wherein a first sliding chute is disposed on the inner side of the first side plate, and the first sliding chute is parallel to a bottom portion of the first side plate;
   wherein a second sliding chute is disposed on the inner side of the second side plate, and the second sliding chute is parallel to a bottom portion of the second side plate; heights of the first sliding chute and the second sliding chute are the same.

8. The flexible bottom shell as claimed in claim 5, wherein an end of the first half shell is connected to the connection plates, and a pin hole is positioned on an inner side of the end of the first half shell; the pin hole is correspondingly connected to the pin axle of the fixed plate;
   wherein an end of the second half shell is connected to the connection plates, and a fixed hole is positioned on an inner side of the end of the second half shell; the fixed hole is correspondingly connected to the fixed axle of the fixed plate.

9. A flexible display device, comprising:
a flexible bottom shell comprising a first half shell, a second half shell, and a bendable part connecting the first half shell to the second half shell;
a first middle frame slidingly arranged in the first half shell;
a second middle frame slidingly arranged in the second half shell;
a flexible supporting plate; wherein a first end of the flexible supporting plate is fixed on a surface of the first middle frame;
a flexible display panel attached to a surface of the flexible supporting plate;
a flexible protecting plate attached to a surface of the flexible display panel;
wherein the bendable part comprises a plurality of connection plates, the plurality of the connection plates are successively bonded and are successively hinged together;
wherein each connection plate comprises a baseplate; a first side plate is disposed on a first end of the baseplate, and a second side plate is disposed on a second end of the baseplate corresponding to the first end of the baseplate, the second side plate is symmetrical to the first side plate; a first fixed hole is positioned on a center of an inner side of the first side plate, and a first pin hole is positioned on an off-centered from the inner side of the first side plate; a second fixed hole is positioned on a center of an inner side of the second side plate, and a second pin hole is positioned on an off-centered from the inner side of the second side plate;
hinge pieces located on an inner side of the connection plates to connect the adjacent connection plates, wherein the hinge pieces comprise a fixed plate, a fixed axle, and a pin axle; the fixed axle and the pin axle are perpendicular to a surface of the fixed plate; the fixed axle is closed to a first end of the fixed plate, and the pin axle is close to a second end of the fixed plate corresponding to the first end of the fixed plate;
wherein the fixed axle is inserted into the fixed holes of the connection plates, and the pin axle is inserted into the pin holes of the connection plates.

10. The flexible display device as claimed in claim 9, wherein the baseplate of the connection plates extends out to form an arcuate plate, and the arcuate plate is located on a side of the connection plates, the pin hole is positioned on the side of the connection plates.

11. The flexible display device as claimed in claim 9, wherein chamfers are disposed on top portions of sides of the first side plate and the second side plate.

12. The flexible display device as claimed in claim 11, wherein a first sliding chute is disposed on the inner side of the first side plate, and the first sliding chute is parallel to a bottom portion of the first side plate;
wherein a second sliding chute is disposed on the inner side of the second side plate, and the second sliding chute is parallel to a bottom portion of the first side plate; heights of the first sliding chute and the second sliding chute are the same;
an edge of a first side of the flexible supporting plate is disposed in the first sliding chute, and an edge of a second side of the flexible supporting plate is disposed in the second sliding chute.

13. The flexible display device as claimed in claim 9, wherein an end of the first half shell is connected to the connection plates, and a pin hole is positioned on an inner side of the end of the first half shell; the pin hole is correspondingly connected to the pin axle of the fixed plate;
wherein an end of the second half shell is connected to the connection plates, and a fixed hole is positioned on an inner side of the end of the second half shell; the fixed hole is correspondingly connected to the fixed axle of the fixed plate.

* * * * *

UNITED STATES PATENT AND TRADEMARK OFFICE
CERTIFICATE OF CORRECTION

PATENT NO. : 10,306,788 B2
APPLICATION NO. : 15/569116
DATED : May 28, 2019
INVENTOR(S) : Wei Bi et al.

Page 1 of 1

It is certified that error appears in the above-identified patent and that said Letters Patent is hereby corrected as shown below:

On the Title Page

(73) Assignee Name:
Change "Wuhan China Start Optoelectronics Technology Co., Ltd."
To -- Wuhan China Star Optoelectronics Technology Co., Ltd. --

Signed and Sealed this
Thirtieth Day of July, 2019

Andrei Iancu
*Director of the United States Patent and Trademark Office*